US010672439B2

(12) United States Patent
Sreenivasula Reddy et al.

(10) Patent No.: US 10,672,439 B2
(45) Date of Patent: Jun. 2, 2020

(54) DATA DEPENDENT KEEPER ON GLOBAL DATA LINES

(71) Applicant: GLOBALFOUNDRIES INC., Grand Cayman (KY)

(72) Inventors: Dhani Reddy Sreenivasula Reddy, Bengaluru (IN); Md Nadeem Iqbal, Katihar (IN)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 16/031,350

(22) Filed: Jul. 10, 2018

(65) Prior Publication Data

US 2020/0020370 A1 Jan. 16, 2020

(51) Int. Cl.
| G11C 7/12 | (2006.01) |
| G11C 7/06 | (2006.01) |
| G11C 11/4097 | (2006.01) |
| G11C 11/4091 | (2006.01) |
| G11C 11/4094 | (2006.01) |
| G11C 7/18 | (2006.01) |

(52) U.S. Cl.
CPC ............. *G11C 7/12* (2013.01); *G11C 7/06* (2013.01); *G11C 7/18* (2013.01); *G11C 11/4091* (2013.01); *G11C 11/4094* (2013.01); *G11C 11/4097* (2013.01)

(58) Field of Classification Search
CPC ............. G11C 7/12; G11C 7/22; G11C 7/067
See application file for complete search history.

(56) References Cited

U.S. PATENT DOCUMENTS

| 4,421,996 | A | * | 12/1983 | Chuang | G11C 11/4091 327/297 |
| 5,068,548 | A | * | 11/1991 | El Gamel | H03K 19/09448 326/110 |
| 5,465,054 | A | * | 11/1995 | Erhart | H03K 19/00315 326/34 |
| 5,555,202 | A | * | 9/1996 | Chu | G06F 5/015 377/64 |
| 5,963,484 | A | * | 10/1999 | Jung | G11C 7/067 365/189.09 |
| 5,999,568 | A | * | 12/1999 | Yiu | H04L 25/03885 333/28 R |
| 6,067,256 | A | * | 5/2000 | Yamashita | G11C 7/12 365/189.04 |
| 6,239,640 | B1 | * | 5/2001 | Liao | H03K 3/012 327/211 |
| 6,671,862 | B1 | * | 12/2003 | Seward | G06F 17/5036 716/113 |
| 7,099,202 | B1 | * | 8/2006 | Son | G11C 7/10 365/189.02 |

(Continued)

OTHER PUBLICATIONS

Chiu et al., "A subthreshold SRAM with embedded data-aware write-assist and adaptive data-aware keeper", IEEE International Symposium on Circuits and Systems (ISCAS), 2016, 4 pages.

*Primary Examiner* — Huan Hoang
*Assistant Examiner* — Jay W. Radke
(74) *Attorney, Agent, or Firm* — Michael Le Strange; Andrew M. Calderon; Roberts Calderon Safran & Cole, P.C.

(57) ABSTRACT

The present disclosure relates to a structure which includes at least one keeper circuit which is configured to hold data to a precharged state during a first operation and be disabled during a second operation.

20 Claims, 4 Drawing Sheets

(56) References Cited

U.S. PATENT DOCUMENTS

| | | | | |
|---|---|---|---|---|
| 7,106,635 | B1* | 9/2006 | Mandal | G11C 7/12 |
| | | | | 365/189.11 |
| 7,307,457 | B2* | 12/2007 | Braceras | G11C 7/1051 |
| | | | | 326/112 |
| 9,940,992 | B2 | 4/2018 | Atallah et al. | |
| 2002/0008559 | A1* | 1/2002 | Krishnamurthy | H04L 25/028 |
| | | | | 327/206 |
| 2005/0024057 | A1* | 2/2005 | Desplats | G01R 31/311 |
| | | | | 324/334 |
| 2006/0166415 | A1* | 7/2006 | Afentakis | H01L 27/1214 |
| | | | | 438/151 |
| 2007/0229116 | A1* | 10/2007 | Braceras | G11C 7/1051 |
| | | | | 326/98 |
| 2009/0185430 | A1* | 7/2009 | Wilson | G11C 7/065 |
| | | | | 365/189.05 |
| 2012/0155188 | A1* | 6/2012 | Buettner | G11C 7/12 |
| | | | | 365/189.02 |
| 2012/0317374 | A1* | 12/2012 | Chen | G11C 11/413 |
| | | | | 711/154 |
| 2013/0077416 | A1* | 3/2013 | Hold | G11C 7/18 |
| | | | | 365/189.15 |
| 2013/0176795 | A1* | 7/2013 | Dengler | G11C 7/12 |
| | | | | 365/189.05 |
| 2014/0293715 | A1* | 10/2014 | Barth, Jr. | G11C 7/067 |
| | | | | 365/189.11 |
| 2015/0117120 | A1* | 4/2015 | Barth, Jr. | G11C 7/067 |
| | | | | 365/189.02 |
| 2015/0279454 | A1* | 10/2015 | Sano | G11C 7/12 |
| | | | | 365/189.09 |

* cited by examiner

DATA DEPENDENT KEEPER ON GLOBAL DATA LINES

FIELD OF THE INVENTION

The present disclosure relates to a data dependent keeper, and more particularly, to a circuit and method for a data dependent clocked keeper on global data lines.

BACKGROUND

In a multi-core memory circuitry, a precharge and evaluate circuit is usually needed in the read data path to gain performance. The precharge and evaluate circuit of the multi-core memory circuitry needs a keeper circuit in order to hold data on the data path when not driven.

Keeper sizing is very critical and requires numerous stacks in the data path to maintain the sizing. Further, the evaluate circuit has a large resistor-capacitor (RC) network either on the gate or on the drain of a transistor. Data paths being highly resistive add another challenge to the size of the evaluate circuit and limits performance.

SUMMARY

In an aspect of the disclosure, a structure includes at least one keeper circuit which is configured to hold data to a precharged state during a first operation and be disabled during a second operation.

In another aspect of the disclosure, a circuit includes a sense amplifier circuit comprising at least one keeper circuit which is clocked with a sense amplifier enable signal, holds data to a precharged state during a precharge operation, and is disabled during an evaluating operation, and a multiplexer circuit which comprises at least one passgate and is connected to the sense amplifier circuit through a read global data line.

In another aspect of the disclosure, a method includes holding data to a precharged state during a precharge operation using a keeper circuit, and disabling the keeper circuit during an evaluating operation.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a data dependent keeper, and more particularly, to a circuit and method for a data dependent clocked keeper on global data lines. Advantageously, by implementing the circuit disclosed herein, the data aware clocked keeper on global data lines is functional on high resistive data path lines. Further, by implementing the circuit disclosed herein, no additional area is required in comparison to conventional circuitry. In addition, the present disclosure also improves the access time (i.e., improves the system frequency) over the conventional circuitry.

In the present disclosure, there is no keeper on a global data line signal GDLN. Further, in comparison to conventional circuitry in which a read global data line RGDLN is driven only during a read operation, the circuit of the present disclosure is always driven to maintain a precharge state. In the conventional circuitry, the read global data line RGDLN needs to be on a low resistance metal to overcome a data keeper. In contrast, in the present disclosure, there is no requirement for the read global data line RGDLN to be on a low resistance metal (i.e., the read global data line RGDLN can be on a high resistance metal). Accordingly, in embodiments, the read global data line RGDLN described herein can be implemented in a lower metal (i.e., high resistance metal) due to the keeper being disabled/eliminated during a read operation.

Moreover, in the circuit described herein, one data access is always faster and only reads a precharged state. In addition, the functional margin required in the conventional circuitry due to the keeper is eliminated by implementation of the circuit described herein.

Figure 1:
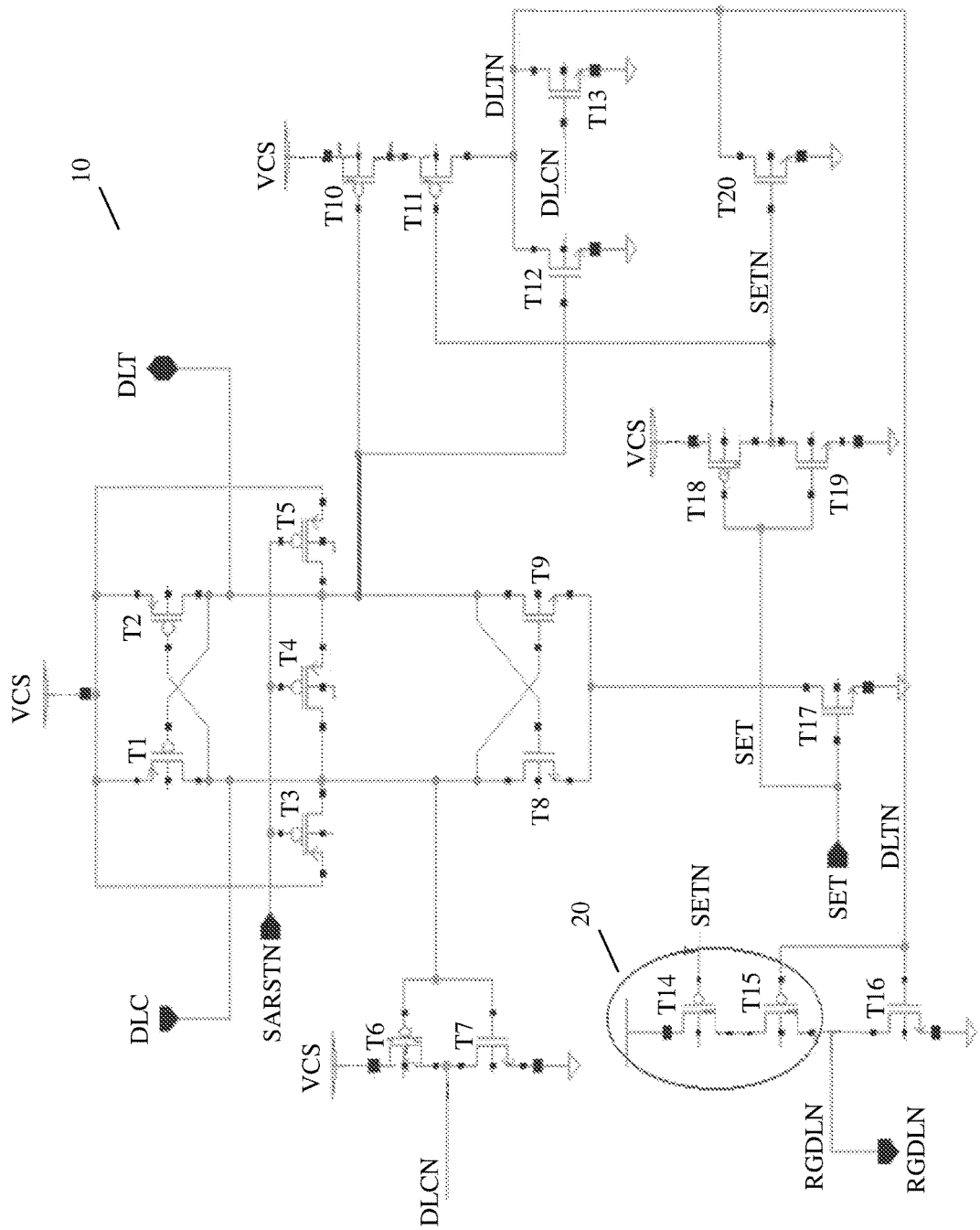
FIG. 1 shows a sense amplifier circuit in accordance with aspects of the present disclosure.

FIG. 1 shows a sense amplifier circuit in accordance with aspects of the present disclosure. In FIG. 1, the sense amplifier circuit 10 comprises the following components: PMOS transistors T1-T6, T10, T11, T14, T15, and T18; NMOS transistors T7-T9, T12, T13, T16, T17, T19, and T20; a power supply signal VCS; a digit line complement signal DLC; a digit line true signal DLT; a read global data line RGDLN; a sense amplifier enable signal SETN; a sense amplifier reset signal SARSTN; an inverted digit line complement DLCN; an inverted digit line true DLTN; and an inverted sense amplifier enable signal SET.

In embodiments, the transistors T1 and T2 are cross-coupled, transistors T8 and T9 are cross-coupled, and the transistors T3, T4, and T5 are in series and are gated with the sense amplifier reset signal SARSTN. Further, the following components are in series: transistor T6 and transistor T7; transistor T1 and transistor T8; transistor T2 and transistor T9; transistor T10 and transistor T11; transistor T14, transistor T15, and transistor T16; and transistor T18 and transistor T19. A keeper 20 includes the transistors T14 and T15.

In operation, during a read0 operation (i.e., a precharge operation), the data is held to a precharged state of high. The sense amplifier enable signal SETN is a clocked signal which will default high. Further, during the read0 operation, the digit line true signal DLT goes high, the digit line complement signal DLC goes low, the inverted digit line true DLTN will be set to low, and the sense amplifier enable signal SETN is set to low. This will force the read global data line RGDLN to high. Further, the keeper 20 is clocked with the sense amplifier enable signal SETN, such that the keeper 20 is active only when the sense amplifier is fired. The read global data line RGDLN is released (i.e., no longer generating the precharge signal) before the inverted sense amplifier enable signal SET fires and is closed after the data (i.e., QOSTROBE) goes away.

In operation, during a read1 operation (i.e., an evaluating operation), the digit line true signal DLT goes low, and the digit line complement signal DLC goes high. The sense amplifier enable signal SETN is set to low during a functional read operation and enables the precharge path regardless of the whether the read0 operation or the read1 operation is performed. Further, during the read1 operation, the inverted digit line true DLTN will be set to high as the digit line true signal DLT goes low. When the inverted digit line true DLTN is set high, the read global data line RGDLN will be evaluated as low. In the situation of the read0 operation, the inverted digit line true DLTN will be set to low as the digit line true signal DLT remains high. When the inverted digit line true DLTN is set to low, the read global data line RGDLN will be driven high and retain the precharged state. In view of the above, the read0 and read1 operations allow for the keeper 20 to be a data dependent clocked keeper.

Figure 2:
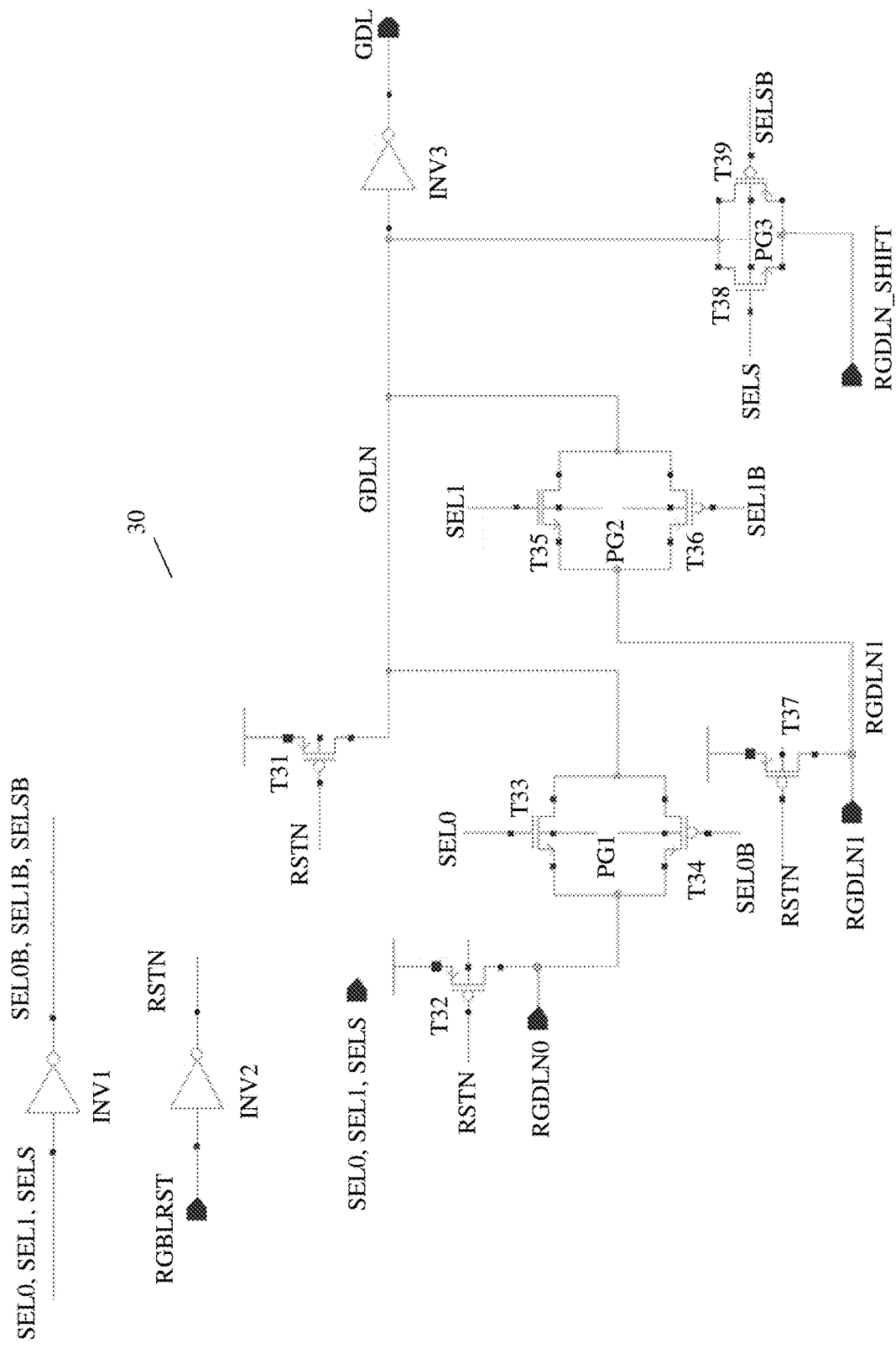
FIG. 2 shows a multiplexer circuit in accordance with aspects of the present disclosure.

FIG. 2 shows a multiplexer circuit in accordance with aspects of the present disclosure. In FIG. 2, the multiplexer circuit 30 comprises the following components: transistors T31, T32, T34, T36, T37, and T39; transistors T33, T35, and T38; inverters INV1, INV2, and INV3; selection signals SEL0, SEL1, and SELS; read global bit line reset signal RGBLRST; inverted read global bit line reset signal RSTN; read global data line for first column RGDLN0; read global data line for second column RGDLN1; inverted selection signals SEL0B, SEL1B, and SELSB; global data line GDLN; inverted global data line GDL; shifted read global data line RGDLN_SHIFT; and passgates PG1, PG2, PG3.

In embodiments, the selection signals SEL0, SEL1, and SELS are inverted by the inverter INV1 to generate the inverted selection signals SEL0B, SEL1B, and SELSB. Further, the read global bit line reset signal RGBLRST is inverted by the inverter INV2 to generate the inverted read global bit line reset signal RSTN. The global data line GDLN is also inverted by the inverter INV3 to generate the inverted global data line GDL. The passgate PG1 includes the transistor T33 and the transistor T34. The passgate PG2 includes the transistor T35 and the transistor T36. The passgate PG3 includes the transistor T38 and the transistor T39.

In operation, the transistor T32 of the multiplexer circuit 30 is used to pull the read global data line for the first column RGDLN0 high in order to precharge and hold data. Therefore, in comparison to the conventional circuitry, in this operation state, the multiplexer circuit 30 does not need a keeper to precharge and hold data.

Figure 3:
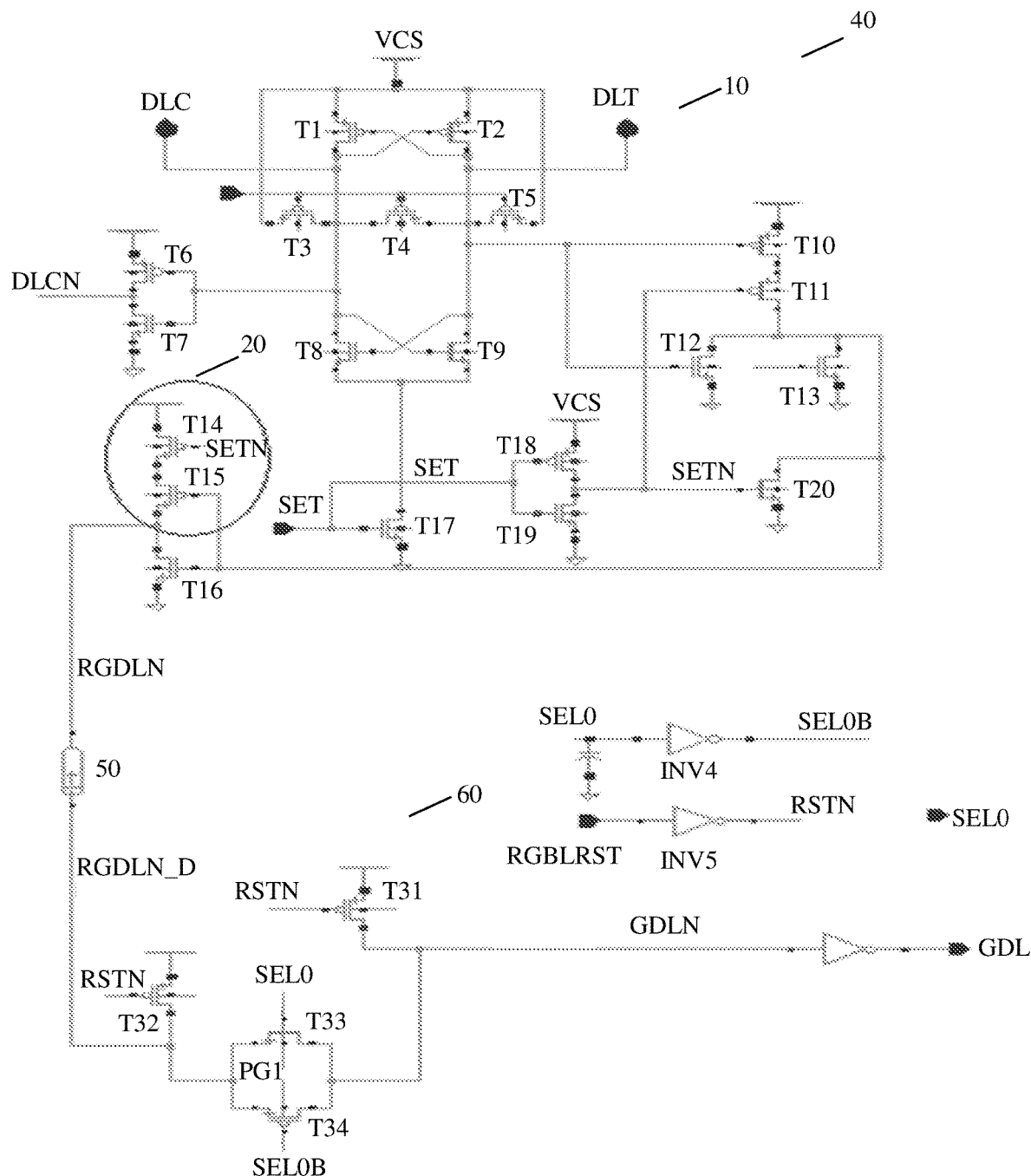
FIG. 3 shows a RC model with the sense amplifier circuit and the multiplexer circuit in accordance with aspects of the present disclosure.

FIG. 3 shows a RC model with the sense amplifier circuit and the multiplexer circuit in accordance with aspects of the present disclosure. In FIG. 3, the RC model 40 includes the following components: the sense amplifier circuit 10 (as shown in FIG. 1), a resistor-capacitor (RC) component 50, and a portion 60 of the multiplexer circuit 30. In particular, the sense amplifier circuit 10 in FIG. 3 is connected to the portion 60 of the multiplexer circuit 30 through the RC component 50. Further, in FIG. 3, an inverter INV4 receives the selection signal SEL0 and outputs the inverted selection signal SEL0B. An inverter INV5 receives the read global bit line reset signal RGBLRST and outputs the inverted read global bit line reset signal RSTN.

In embodiments, after the read global data line RGDLN from the sense amplifier circuit 10 passes through the RC component 50, a modified read global data line RGDLN_D is input to the portion 60 of the multiplexor circuit 30. In particular, the modified read global data line RGDLN_D is connected to the source of the transistor T32 and the input of the passgate PG1.

In operation, as similarly described in FIG. 1, during the read0 operation (i.e., a precharge operation), the digit line true signal DLT goes high, the digit line complement signal DLC goes low, the inverted digit line true DLTN will be set to low, and the sense amplifier enable signal SETN is set to low. This will force the read global data line RGDLN to high. After the read global data line RGDLN is passed through the RC component 50, the modified read global data line RGDLN_D is output to the source of the transistor T32 and the input of the passgate PG1. Further, as similarly described in FIG. 2, the transistor T32 of the portion 60 is used to pull the modified read global data line RGDLN_D high in order to precharge and hold data. Therefore, in comparison to the conventional circuitry, the portion 60 does not need a keeper to precharge and hold data.

Figure 4:
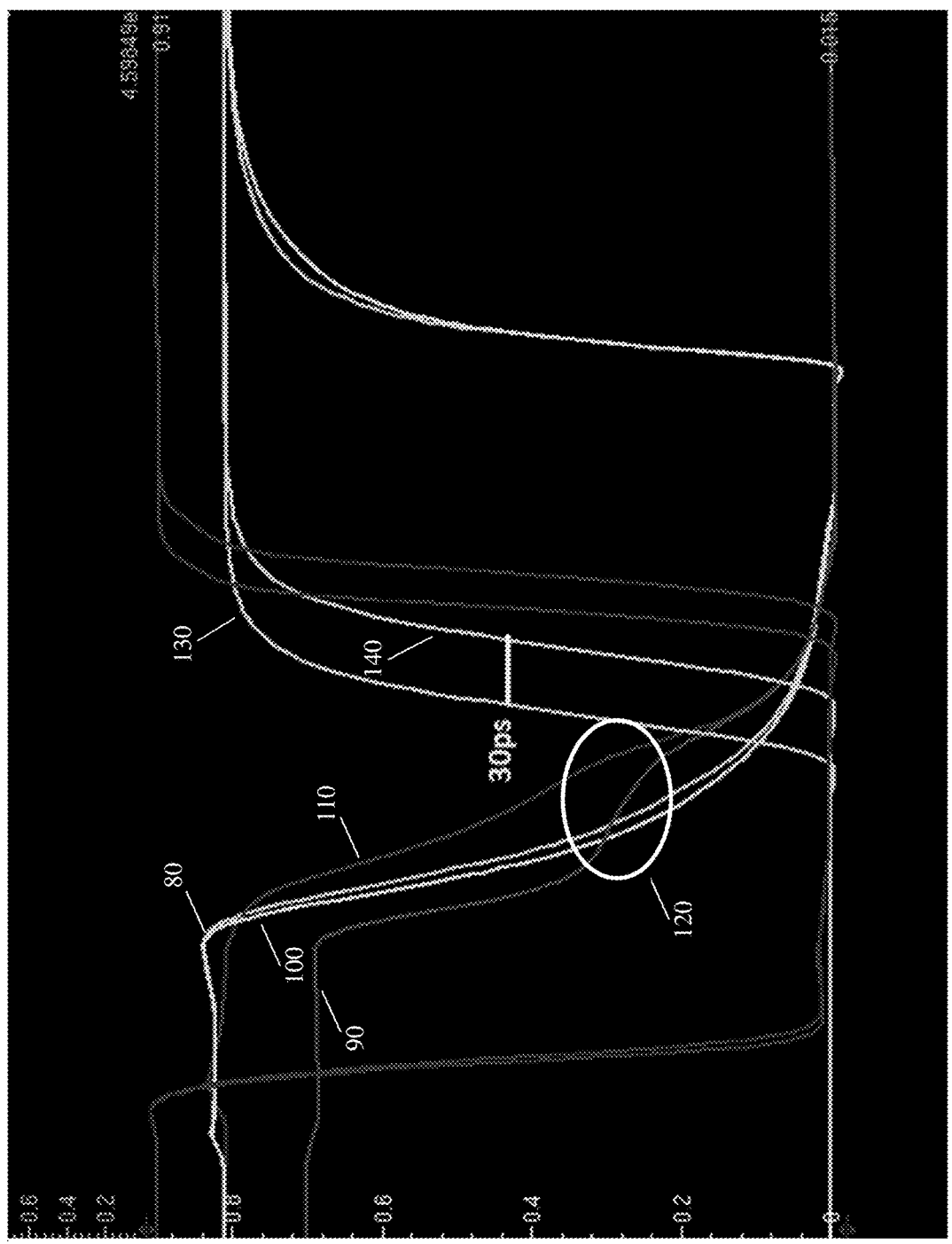
FIG. 4 shows waveform graphs of the RC model in accordance with aspects of the present disclosure and the conventional circuitry.

FIG. 4 shows waveform graphs of the RC model and the conventional circuitry. In FIG. 4, the waveform graphs 70 include a read global data line RGDLN 80 in accordance with aspects for the present disclosure described herein; a read global data line RGDLN 90 for the conventional circuitry; a global data line GDLN 100 in accordance with aspects for the present disclosure described herein; a global data line GDLN 110 for the conventional circuitry; a keeper fight 120 for the conventional circuitry; an output 130 in accordance with aspects for the present disclosure described herein; and an output 140 for the conventional circuitry.

In the conventional circuitry, there is a keeper fight 120 between the read global data line RGDLN 90 and the global data line GDLN 110. In contrast, in implementing the circuit described herein, the read global data line RGDNL 80 and the global data line GDLN 100 does not have a keeper fight. Further, as shown in the waveform graphs 70 of FIG. 4, the present circuitry can eliminate a functional margin needed due to the keeper fight 120. Eliminating the functional margin will improve the access time (i.e., system frequency improvement), as shown by the difference in FIG. 4 (i.e., approximately 30 picoseconds) between the output 130 (for the present disclosure) and the output 140 (for the conventional circuitry). Further, in FIG. 4, there is approximately a 9% improvement in the timing of the read global data line RGDLN 80 in comparison to the read global data line RGDLN 90 (for the conventional circuitry).

The circuit and method for a data dependent clocked keeper on global data lines of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for a data dependent clocked keeper on global data lines of the present disclosure has been adopted from integrated circuit (IC) technology. For example, the structures are built on wafers and are realized in films of material patterned by photolithographic processes on the top of a wafer. In particular, the fabrication of the circuit and method for a data dependent clocked keeper on global data lines uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising at least one keeper circuit which is configured to hold data to a precharged state during a first operation and be disabled during a second operation, wherein the at least one keeper circuit comprises:
   a first transistor that is directly gated by a sense amplifier enable signal;
   a second transistor that has a source connected to a drain of the first transistor, and is gated by an inverted digital line true signal; and
   a third transistor that has a drain connected to a drain of the second transistor, a source directly connected to ground, and is gated by the inverted digital line true signal.

2. The structure of claim 1, wherein the first transistor is between a power supply signal and a source of the second transistor and the second transistor is between the first transistor and the drain of the third transistor.

3. The structure of claim 2, wherein the first transistor and the second transistor are PMOS transistors and the third transistor is a NMOS transistor.

4. The structure of claim 3, wherein the drain of the second transistor is connected to a read global data line signal.

5. The structure of claim 4, further comprising a RC component connected to the read global data line signal.

6. The structure of claim 1, further comprising a sense amplifier circuit which is connected to the at least one keeper circuit.

7. The structure of claim 6, wherein the at least one keeper circuit is configured to hold data to the precharged state when the sense amplifier circuit is fired.

8. The structure of claim 1, further comprising a sense amplifier which is connected to the at least one keeper circuit through a NMOS transistor.

9. The structure of claim 8, wherein the NMOS transistor has a drain directly connected to the sense amplifier, a source directly connected to the ground, and is gated by an inverted sense amplifier enable signal.

10. A circuit, comprising:
    a sense amplifier circuit comprising at least one keeper circuit which is clocked with a sense amplifier enable signal, holds data to a precharged state during a precharge operation, and is disabled during an evaluating operation; and
    a multiplexer circuit which comprises at least one pass-gate and is connected to the sense amplifier circuit through a read global data line,
    wherein the multiplexer circuit further comprises a multiplexer transistor which is gated by an inverted read global bit line reset signal and which has a drain connected to the read global data line, and
    the multiplexer transistor is configured to pull the read global data line to the precharged state and hold the data.

11. The circuit of claim 10, wherein the at least one keeper circuit comprises:
    a first transistor which is gated by the sense amplifier enable signal; and
    a second transistor which is gated by an inverted digit line true signal.

12. The circuit of claim 11, wherein the first transistor is between a power supply signal and a source of the second transistor and the second transistor is between the first transistor and a drain of a third transistor.

13. The circuit of claim 12, wherein the first transistor and the second transistor are PMOS transistors and the third transistor is a NMOS transistor.

14. The circuit of claim 12, wherein a drain of the second transistor is connected to the read global data line signal.

15. The circuit of claim 12, wherein the third transistor is gated by the inverted digit line true signal.

16. The circuit of claim 10, wherein the multiplexer circuit comprises a RC component connected to the read global data line signal.

17. The circuit of claim 10, wherein the at least one keeper circuit is configured to hold data to the precharged state when a sense amplifier of the sense amplifier circuit is fired.

18. A method, comprising:
    holding data to a precharged state during a precharge operation using a keeper circuit; and
    disabling the keeper circuit during an evaluating operation, wherein the keeper circuit comprises:
    a first transistor that is directly gated by a sense amplifier enable signal;
    a second transistor that has a source connected to a drain of the first transistor, and is gated by an inverted digital line true signal; and
    a third transistor that has a drain connected to a drain of the second transistor, a source directly connected to ground, and is gated by the inverted digital line true signal.

19. The method of claim 18, wherein the data is held in the precharged state when a sense amplifier is fired.

20. The method of claim 18, further comprising clocking the keeper circuit with a sense amplifier enable signal.

* * * * *